United States Patent [19]

Calhoun et al.

[11] Patent Number: 5,300,340
[45] Date of Patent: Apr. 5, 1994

[54] ELECTRICALLY CONDUCTIVE PRESSURE-SENSITIVE ADHESIVE TAPE

[75] Inventors: Clyde D. Calhoun, Grant Township, Washington County; Maurice J. Fleming, Cottage Grove, both of Minn.; George D. Foss, Amery; Richard L. Renstrom, Luck, both of Wis.

[73] Assignee: Minnesota Mining and Manufacturing Company, St. Paul, Minn.

[21] Appl. No.: 874,553

[22] Filed: Apr. 22, 1992

Related U.S. Application Data

[63] Continuation of Ser. No. 160,773, Feb. 26, 1988, abandoned.

[51] Int. Cl.⁵ .................................................. C09J 7/02
[52] U.S. Cl. .................................... 428/40; 428/144; 428/148; 428/206; 428/328; 428/343; 428/356; 428/906
[58] Field of Search ............ 428/144, 148, 164, 200, 428/206, 328, 356, 343, 40, 906

[56] References Cited

U.S. PATENT DOCUMENTS

| | | | |
|---|---|---|---|
| 3,475,213 | 10/1969 | Stow | 117/227 |
| 3,511,178 | 5/1970 | Curtin | 101/450 |
| 3,514,326 | 5/1970 | Stow | 117/227 |
| 4,054,714 | 10/1977 | Mastrangelo | 428/328 |
| 4,113,981 | 9/1978 | Fujita et al. | 174/88 |
| 4,247,594 | 1/1981 | Shea et al. | 428/328 |
| 4,258,100 | 3/1981 | Fujitani et al. | 428/315 |
| 4,447,492 | 5/1984 | McKaveney | 428/328 |
| 4,472,480 | 9/1984 | Olson | 428/332 |
| 4,546,037 | 10/1985 | King | 428/323 |
| 4,548,862 | 10/1985 | Hartman | 428/323 |
| 4,568,602 | 2/1986 | Stow | 428/172 |
| 4,606,962 | 8/1986 | Reylek et al. | 428/148 |
| 4,737,112 | 4/1988 | Jin et al. | 439/66 |
| 4,814,040 | 3/1989 | Ozawa | 156/634 |

FOREIGN PATENT DOCUMENTS

8708027.3 10/1987 Fed. Rep. of Germany ......... H05K 3/32

*Primary Examiner*—Jenna L. Davis
*Attorney, Agent, or Firm*—Gary L. Griswold; Walter N. Kirn; James V. Lilly

[57] ABSTRACT

Electrically conductive elements on two substrates can be electrically interconnected by an adhesive tape containing electrically conductive equiax particles that are individually positioned in the adhesive layer in a predetermined pattern. Each particle is harder than the elements it is to interconnect, so that hand pressure causes the particles to penetrate into the elements, thus creating a reliable electrical connection. Particularly useful particles are glass beads having a metallic coating that is from 0.1 to 2 μm thick.

19 Claims, 2 Drawing Sheets

ELECTRICALLY CONDUCTIVE PRESSURE-SENSITIVE ADHESIVE TAPE

This is a continuation of application Ser. No. 07/160,773 filed Feb. 26, 1988, now abandoned.

BACKGROUND OF THE INVENTION

1. Field of the Invention

The invention concerns adhesive tape, preferably pressure-sensitive adhesive tape, the adhesive layer of which contains particles affording electrical conductivity through the thickness of the layer while being electrically insulating in lateral directions.

2. Description of the Related Art

As is pointed out in U.S. Pat. No. 4,548,862 (Hartman): "modern electronic devices are becoming so small and their electrical terminals are so delicate and closely spaced that it is difficult and expensive to make electrical connections by soldering or other established techniques. U.S. Pat. No. 4,113,981 (Fujita et al.) uses an adhesive layer for individually electrically interconnecting multiple pairs of arrayed electrodes. The adhesive layer includes spherical electrically conductive particles of substantially the same thickness as the adhesive, thus providing a conductive path through each particle that bridges facing pairs of electrodes. The particles are randomly distributed throughout the adhesive layer, but the Fujita patent indicates that if the particles comprise less than 30% by volume of the layer, they will be sufficiently spaced so that the intervening adhesive will insulate against short circuiting between laterally adjacent electrodes. Carbon powder, SiC powder and metal powder are said to be useful.

"U.S. Pat. No. 3,475,213 (Stow) discloses a tape having an electrically conductive backing and a pressure-sensitive adhesive layer which contains a monolayer of electrically conductive particles that could be identical to the adhesive layer of the Fujita patent if Fujita were to use a pressure-sensitive adhesive" (col. 1, lines 15–38 of the Hartman patent). The Stow patent says that the particles should "have a substantial thickness slightly less than the thickness of the adhesive film" (col. 3, lines 1–2), and "essentially none of the particles should extend above the surface of the adhesive to preserve satisfactory adhesion values" (col. 3, lines 39–41). The Stow patent indicates a preference for metal particles, preferably flattened to appropriate thickness before being added to an adhesive-coating mixture, while also suggesting the use of "[m]etallized plastic or glass beads or spheres" and that "the particles can be metal alloys, or composites in which one metal is coated on another" (col. 4, lines 52–55).

The Hartman patent concerns a flexible tape that, like the adhesive layer of the Fujita patent, can adhesively make individual electrical connections between multiple pairs of electrode arrays without short circuiting electrodes of either array by means of small particles that form electrically conductive bridges extending through the thickness of the layer. Each of the particles has a ferromagnetic core and an electrically conductive surface layer such as silver.

U.S. Pat. No. 4,606,962 (Reylek et al.), like the above-discussed patents, discloses a tape that provides electrical conductivity through the thickness of an adhesive layer, and is especially concerned with adhesively attaching a semiconductor die or chip to a substrate to dissipate both heat and static electricity. The adhesive layer of the Reylek tape, which preferably is heat-activatable, contains electrically and thermally conductive particles that at the bonding temperature of the adhesive are at least as deformable as are substantially pure silver spherical particles. The thickness of the particles exceeds the thickness of the adhesive between particles. When the particle-containing adhesive layer is removed from the carrier layer of the transfer tape and compressed between two rigid plates, the particles are flattened to the thickness of the adhesive between particles, thus providing small, flat conductive areas at both surfaces of the adhesive layer. The particles preferably are substantially spherical and made of a metal such as silver or gold or of more than one material such as "a solder surface layer and either a higher melting metal core such as copper or a nonmetallic core" (col. 4, lines 20–21).

The Reylek patent says: "To economize the use of the electrically conductive particles, they may be located only in segments of the novel adhesive transfer tape which are to contact individual electrical conductors" (col. 2, lines 39–42). One technique suggested for so locating the particles is outlined at col. 2, lines 42–55, where the patentee (1) forms a viscous adhesive coating, (2) renders areas of the coating substantially tack-free, (3) applies electrically conductive particles that adhere only to the viscous portions of the coating, and then (4) polymerizes the viscous areas to a substantially tack-free state. When the viscous areas remaining after step (2) are small, the electrically conductive particles are individually positioned in a predetermined pattern.

SUMMARY OF THE INVENTION

The present invention provides pressure-sensitive adhesive tape that can be used to make reliable electrical connections merely by applying ordinary hand pressure. Like adhesive tapes of the Reylek patent, the adhesive layer of the novel tape contains electrically conductive particles that are equiax, i.e., particles having approximately the same thickness in every direction. An equiax particle can be considered to have a diameter, whether or not it is spherical. Like the electrically conductive particles of the Reylek patent, those of the novel tape are of substantially uniform diameter, preferably within the range of 25 to 150 $\mu$m and about equal to or somewhat larger than the adhesive thickness in order to conduct electricity through the thickness of the adhesive layer. The particles should be spaced laterally so that the adhesive layer is laterally electrically insulating. As can be provided by the above-outlined technique of the Reylek patent, the electrically conductive particles of the novel tape are individually positioned in the adhesive layer in a predetermined pattern. In doing so, substantially every particle is partially uncoated at one face of the adhesive.

The tape of the invention differs from tapes of the Reylek patent in that each equiax particle is hard relative to the electrodes or other electrically conductive elements which it is to interconnect. In view of Reylek's express teaching that the particles should be soft and readily conformable in order to establish good electrical contact, it is surprising that hard electrically conductive particles can be employed effectively. Contrary to what might have been expected, however, it is now believed that the hard particles are actually superior to soft particles, since the mere application of hand pressure causes them to penetrate into the conductive elements. To attain sufficient penetration, the equiax particle should have a Knoop Hardness Value (as herein defined) of at least 300. This penetration is believed to perform a sort of wiping action, removing oxides and other surface contamination and thereby creating a metallurgically and electrically superior connection. Additionally, in presently preferred embodiments of the invention, the hard particles are less expensive than Reylek's soft particles.

As demonstrated by electronmicrographs, each electrically conductive particle of the novel tape forms a tiny crater in any electrode or other conductive element of the substrate to which the tape is applied under hand pressure. The formation of a crater assures good electrical connection as well as good thermal conductivity when desired.

A pressure-sensitive adhesive tape of the invention can be a transfer tape if it has a flexible backing, each surface of which is low-adhesion. The transfer tape can be wound upon itself into a roll and used to provide multiple electrical connections between electrodes on two substrates or used between electrical components to provide grounding, static elimination, and electromagnetic shielding in a variety of applications. For such uses, the electrically conductive equiax particles can be widely spaced laterally and still provide adequate electrical interconnection between the adhered objects, because the individual positioning assures the presence of an electrically conductive equiax particle wherever one is needed. Wide lateral spacing also permits the formation of strong adhesive bonds and minimizes the cost of the novel tape, even when the equiax particles are expensive. Wide spacing also ensures against shorting when the novel transfer tape is used for electrically interconnecting closely spaced electrodes on two substrates.

Other useful backings include flexible webs to which the particle-containing adhesive layer is permanently adhered, e.g., an electrically conductive web such as a metal foil or an electrically insulative web bearing electrically conductive elements such as parallel metal strips. For example, a metal foil-backed pressure-sensitive adhesive tape of the invention can be used to provide an electrical connection across a seam between two abutting electrically conductive panels such as may be used as part of an electromagnetically shielded enclosure.

The electrically conductive particles of the novel tape may have cores that need not be electrically conductive when they have electrically conductive surface layers. The Knoop Hardness Value of the core should be at least 300. An especially useful particle is a glass bead having an electrically conductive surface layer such as a metallic coating that is preferably only thick enough to provide the desired electrical conductivity, e.g., from 0.1 to 2 $\mu$m. Other useful core materials that have a Knoop Hardness value of at least 300 include other ceramics, steel, nickel, and work-hardened copper. Even when the conductive surface layer is quite soft, typical electrodes and other electrical elements to be interconnected should be penetrated by the particles upon applying hand pressure whenever the thickness of the conductive surface layer is no more than 10% of the diameter of the hard core.

To ensure good penetration of a particle, the thickness of a relatively soft surface layer should be no more than 5% of the diameter of a hard core. A gold surface layer may be economical only when its thickness is about 0.1% or less of the thickness of the core of the particle. Other useful metal surface layers include silver, copper, aluminum, tin and alloys thereof.

When the particles are metal or have metallic surface layers, the novel tape is both electrically and thermally conductive through its adhesive layer and so is useful for applications requiring thermal conductivity.

A conventional adhesive tape having an exposed adhesive layer can be converted into an adhesive tape of the invention by the sequential steps of 1) attracting electrically conductive equiax particles only to separated dots in a predetermined pattern on a carrier, and 2) while advancing the exposed adhesive layer in synchronism with the carrier, pressing to transfer the attracted particles into the adhesive layer in said pattern.

When the carrier is a rotating drum, this 2-step method can produce electrically conductive tape of almost unlimited length, and the tape can be wound up in roll form for convenient storage and shipment. In such a roll of tape, the determined pattern of electrically conductive particles repeats many times.

When the adhesive is a pressure-sensitive adhesive, the pressure applied in step 2) can be very light, just enough to tack the particles to the adhesive layer. If the adhesive layer is then wound with a low-adhesion backing into roll form, the winding operation inherently forces the conductive particles into the adhesive layer. Even when the particles are forced below the face of the adhesive layer, a pressure-sensitive adhesive does not flow to cover completely the embedded particles at that face.

DETAILED DESCRIPTION

For most applications of the novel tape, the breadth of the dots formed in step 1) of the above 2-step process should be small enough that only one equiax particle is attracted to each position, but when each dot is large enough to make it fairly certain that there will be a particle at every dot, it can be expected that two or possibly three particles will be deposited side by side at a few positions. When only one equiax particles per dot is desired, each dot preferably is roughly circular and has a diameter within the range of 30 to 90% of the diameter of the equiax particles. When using spherical particles 55 $\mu$m in diameter, good results have been attained with dots 45 $\mu$m in diameter. When the diameter of the dots substantially exceeds the diameter of the equiax particles, a monolayer of several particles may be attracted to each dot.

Preferably the dots and the particles they attract are as widely spaced as possible while still providing the desired conductivity through the adhesive layer. Wide spacing provides the strongest possible bonding as well as economy, especially when the particles include expensive material such as silver or gold. Wide spacing of the particles also ensures that the adhesive layer of the novel tape is laterally nonconductive and can be used for making electrical connections between two arrays of electrical terminals without any danger of shorting closely spaced electrodes. To this end, the electrically conductive equiax particles preferably occupy no more than about 5% of the area of the adhesive layer of the novel tape, and more preferably occupy from 0.05 to 1.0% of that area.

The electrically conductive particles may be arranged in rows extending both longitudinally and laterally over the full area of the adhesive layer, so that there is no need to align pieces of the tape with substrates to which they are to be adhered. However, to form electrical connections at specific locations, e.g., to pads of an integrated circuit chip, the electrically conductive particles may be positioned only in areas of the tape that will contact the pads, the other areas of the tape preferably being substantially free from the particles. For this application, it is sometimes desirable to locate a plurality of particles at each pad-contacting area.

Preferably the thickness of the adhesive layer of the novel tape between the electrically conductive particles is from 25 to 150 μm. Adhesive thicknesses above that range may be uneconomical, while thicknesses below that range may not provide full contact between the adhesive layer and a substrate which is not perfectly flat. When the adhesive is pressure-sensitive and is coated from solution or emulsion, it is difficult to obtain uniform coatings much greater than 50 μm.

For most uses, the average diameter of tile conductive equiax particles should be from 5 to 50% greater than the thickness of the adhesive layer between particles. When the novel adhesive tape is used for electrically connecting two arrays of tiny metal electrodes or pads which are slightly raised above the adjacent surfaces, the application of ordinary hand pressure can cause the adhesive to flow into the depressions between the electrodes, thus permitting the diameters of the particles to be somewhat less than the original thickness of the adhesive layer.

The equiax particles of the novel tape preferably are substantially spherical. This ensures that the pressure applied when bonding two substrates together is concentrated at very small areas of each particle. When the spherical particles are about 50 μm in diameter, hand pressure may force them into solder-coated or soft-copper electrodes to about 10% of their height, thus forming craters about 30 μm in breadth and extending across about 74 degrees of arc. Further penetration tends to be limited, due to the rapidly increasing area of contact between the spherical particle and electrode and possibly also due to dissipation of the applied pressure into particle-free areas of the adhesive layer.

The carrier of step 1) of the above-outlined 2-step process can be provided by a printing plate marketed by Toray Industries as "Toray Waterless Plate." It has a flexible sheet of aluminum bearing a layer of photosensitive material covered with a layer of silicone rubber. Upon exposure to light through a half-tone screen, the silicone rubber of a positive-acting plate causes the photosensitive material to bind itself firmly to the silicone rubber in areas where the light strikes, after which the silicone rubber in unexposed areas can be brushed off, leaving the silicone rubber only in the predetermined pattern provided by the light exposure. The printing plate is then wrapped onto a cylinder, and the cylinder is rotated through a fluidized bed of electrically conductive particles. The particles are attracted to the printing plate only where the silicone rubber remains and are repelled by the ink-receptive areas. Upon moving an adhesive tape in synchronism with the rotating printing plate, the particles are picked up by and become embedded into the adhesive layer in the pattern of the printing plate. That pattern repeats a large number of times over a long length of the tape.

The adhesive of the novel tape preferably is a pressure-sensitive adhesive that is aggressively tacky and so forms strong bonds on contact with substrates such as printed circuit panels. The pressure-sensitive adhesive may be substantially nontacky at room temperature if it becomes tacky at an elevated temperature at which it is used to provide electrically conductive connections.

Preferred pressure-sensitive adhesive tapes of the invention have silicone pressure-sensitive adhesives which form exceptionally strong bonds to a wide variety of surfaces, including low energy surfaces of materials that are widely used in printed circuitry, e.g., polyethylene, polypropylene, and poly(tetrafluoroethylene). Furthermore, the bonds remain intact when exposed to large fluctuations in temperature. Especially good in these respects are siloxane pressure-sensitive adhesives such as poly(dimethylsiloxane) pressure-sensitive adhesive (Dow Corning DC 284) and phenyl-containing siloxane pressure-sensitive adhesive (GE 6574). These siloxane pressure-sensitive adhesives are so aggressively tacky that when marketed as transfer tapes, specially prepared backings are required, e.g., a biaxially oriented poly(ethyleneterephthalate) film, each surface of which has been treated to make it low-adhesion.

Among other classes of adhesives that can be used in the novel tape are thermoplastic adhesives (such as polyolefins, polyurethanes, polyesters, acrylics, and polyamides) and thermosetting adhesives (such as epoxy resins, phenolics, and polyurethanes).

When the adhesive of the novel tape is a silicone pressure-sensitive adhesive and the moving carrier of the above-outlined two-step process is a "Toray Waterless Plate," a transfer roll should be positioned between the exposed adhesive layer and the silicone rubber of tile printing plate in carrying out the above-outlined 2-step process. This avoids the danger of the adhesive transferring to the printing plate. The surface of the transfer roll should be selected to cause the electrically conductive particles to transfer from the silicone rubber of the printing plate, while acting as a release surface in relation to the silicone pressure-sensitive adhesive.

Because silicone adhesives are coated from solution or emulsion, it is difficult to obtain uniform coatings greater than about 50 μm in thickness. Where thicker pressure-sensitive adhesive coatings are desired, it may be desirable either to apply multiple layers of the adhesive or to photopolymerize an adhesive in situ. For example, monomeric mixtures of alkyl acrylates and copolymerizable monomers such as acrylic acid can be copolymerized by exposure to ultraviolet radiation to a pressure-sensitive adhesive state.

The use of a printing plate mounted on a cylinder in the above-outlined 2-step process results in a seam that may produce discontinuities in the pattern of electrically conductive particles embedded into the adhesive layer. A conventional adhesive tape that has an exposed adhesive layer can be converted into an adhesive tape of the invention, having no seam in its pattern, by sequentially coating onto a cylinder formulations that provide a cylindrical printing plate, preferably including a silicone rubber layer. Preferred sequential coating formulations are those of U.S. Pat. No. 3,511,178 (Curtin).

If a seam in the pattern is not objectionable, step 1) of the above-outlined 2-step process for making an adhesive tape of the invention can use a carrier provided by the steps of a) coating one face of a sheet of metal foil with rubber and the other face with a photoresist, b) exposing the photoresist to light in a predetermined pattern, c) removing areas of the photoresist corresponding to said pattern, and d) removing the metal foil in said areas to expose the rubber in said predetermined pattern.

Step d) is preferably followed by step e) removing the remaining photoresist.

KNOOP HARDNESS VALUE

The hardness of the core of a tiny electrically conductive particle can be measured after hot-pressing the particle into a fused resin while it is being thermoset and then polishing to remove about half of the particle. See "Metals Handbook", American Society for Metals, 8th Ed., Vol. 8, pages 117-118. The hardness then is measured by ASTM Test Method E384-84 using the Knoop indenter.

THE DRAWING

The invention may be more understandable by reference to the drawing, FIGS. 1-3 of which are schematic, wherein.

Figure 1:
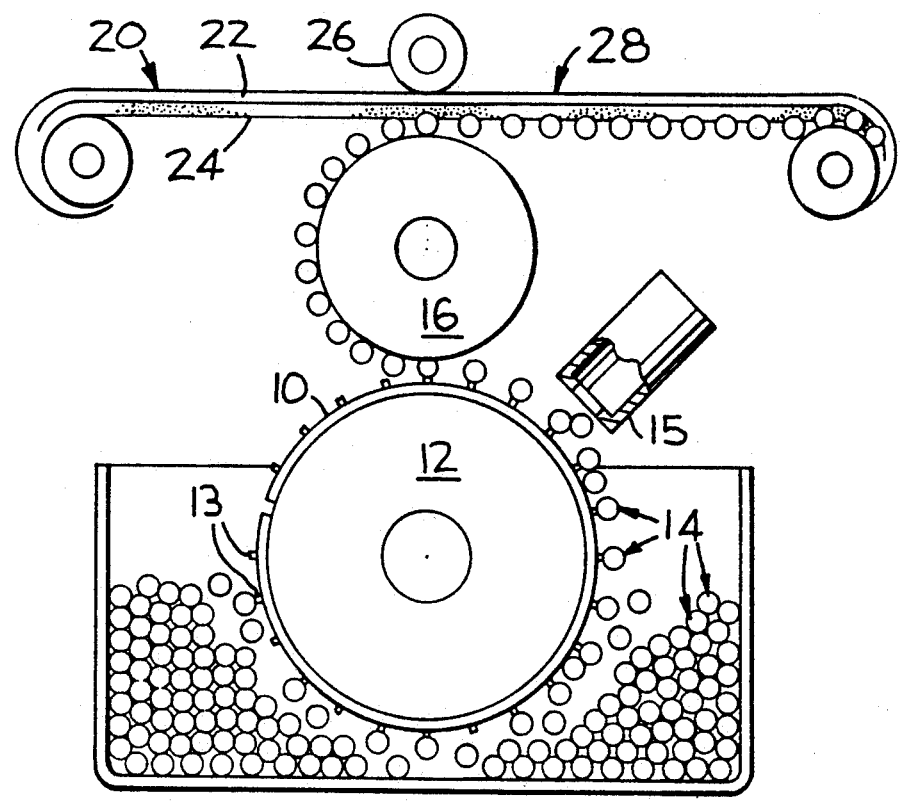
FIG. 1 shows a method of printing electrically conductive particles onto the adhesive layer of a transfer tape to provide a preferred electrically conductive adhesive tape of the invention.
Figure 2:
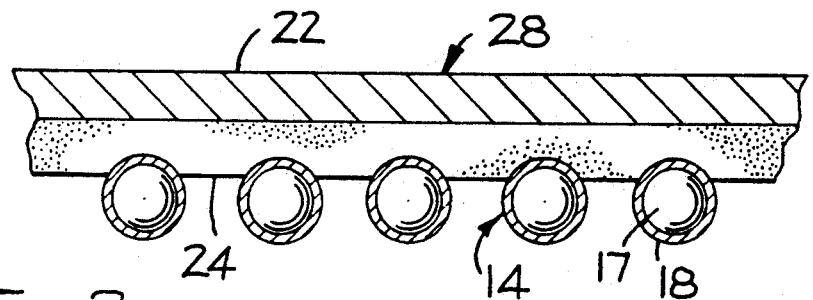
FIG. 2 is an enlarged fragmentary cross section through the tape of FIG. 1 before it has been wound up into a roll.

In FIG. 1, a printing plate 10 has been attached to a rotating cylinder 12 with its outer surface developed to leave roughly circular rubber dots 13. The cylinder is rotated through a fluidized bed of electrically conductive spherical particles 14 of uniform diameter somewhat larger than the diameter of the dots. Each of the particles has a glass bead core 17 having a thin electrically conductive surface layer 18 as seen in FIG. 2. While the cylinder is rotating, the particles are attracted to the rubber dots, and excess particles are removed by suction at 15, leaving only one particle at almost every dot. The adhered particles are transferred to the surface of a rubber-covered roll 16. Moving in synchromism with the roll 16 is a pressure-sensitive adhesive tape 20 having a flexible backing 22 bearing an exposed adhesive layer 24 facing downwardly. The adhesive layer is pressed against the roll 16 by a nip roll 26, thus tacking the attracted particles 14 to the adhesive layer 24. Upon winding the resulting tape 28 into a roll, the electrically conductive particles 14 become embedded into the adhesive layer. Because both faces of the flexible backing 22 have low-adhesion surfaces, the tape 28 can later be unwound for use.

Figure 3:
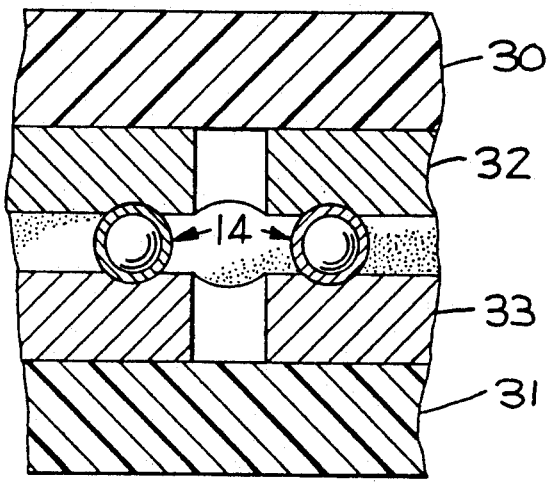
FIG. 3 is an enlarged fragmentary cross section through a piece of the tape of FIG. 1 by which an electrical connection has been made adhesively.

Shown in FIG. 3 are two substrates 30 and 31 which have been adhered together with a piece of the pressure-sensitive adhesive tape 28 of FIG. 2. The illustrated fragment of the resulting composite shows two of the particles 14 electrically connecting two pads or electrodes 32 and 33 on each of the substrates 30 and 31, respectively. Upon application of ordinary hand pressure to the composite, the particles 14 have formed shallow craters in each of the electrodes.

EXAMPLE 1

A negative-acting "Toray Waterless Plate" was exposed to a half-tone screen having 200 lines per inch (79 lines per cm) of circular dots spaced equally in both directions. After being developed, the face of the Toray printing plate had a uniform pattern of silicone rubber dots, each about 60 $\mu$m in diameter and on 125-$\mu$m centers. The imaged plate was then flooded with an excess of silvered glass beads of substantially uniform diameter (about 50 $\mu$m), having a silver surface layer of 0.5 $\mu$m thick. Excess beads were removed by turning the plate over and tapping it. As viewed with a microscope, the spherical particles were held by the silicone rubber dots of the plate in substantially the pattern of the half-tone screen. There was only one spherical particle at almost every dot, but at a few dots were 2 or 3 particles side by side and at an occasional dot there was no particle.

Onto the particle-bearing plate was laid a piece of a pressure-sensitive adhesive transfer tape, the adhesive layer of which was a 96/4 copolymer of isooctyl acrylate/acrylamide polymer about 40 $\mu$m thick, on a silicone-precoated, biaxially oriented poly(ethyleneterephthalate) film that was about 30 $\mu$m thick. After pressing the tape against the plate using a small hand-held printer roller, the tape was lifted from the plate. In its exposed adhesive-coated face were embedded the particles that had been held by the plate.

The resulting particle-bearing adhesive transfer tape was used to adhere a flexible printed circuit (on polyimide film obtained from E.I. du Pont) to a rigid printed circuit board. At the face of each of the flexible and rigid printed circuits was a series of parallel solder-coated copper electrode strips, each 1.4 mm in width and spaced 1.1 mm apart. With the electrode strips of the printed circuits aligned, they were bonded together by a piece of the adhesive transfer tape which was 0.635 cm wide in the lengthwise direction of the electrode strips. The bonding was made in a press at 150° C. for 6 seconds under a pressure of about 1400 kPa.

After cooling, testing with a Simpson continuity meter showed that a good electrical connection had been established between each pair of the electrodes and that no shorting had occurred between adjacent electrodes.

EXAMPLE 2

Figure 4:
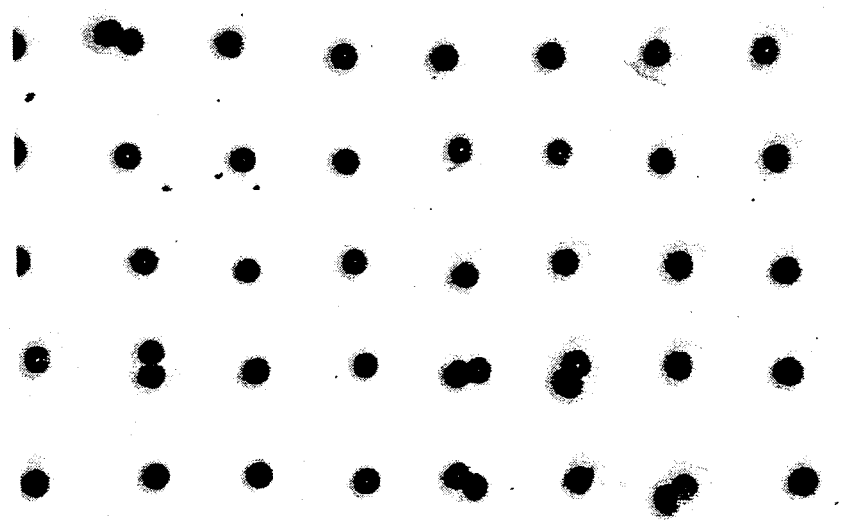
FIG. 4 is a photomicrograph of the exposed surface of a pressure-sensitive adhesive tape made as shown in FIG. 1.

A negative-acting "Toray Waterless Plate" 47.8 cm in length and 12 cm in width was developed to have a uniform pattern of roughly circular silicone rubber dots in rows extending longitudinally and transversely. The dots were uniformly about 60 $\mu$m in diameter on 0.29-mm centers. The developed plate was mounted on a cylinder with its length in the circumferential direction, leaving a seam of about 1 mm. Using apparatus as shown in FIG. 1, the cylinder was rotated in a fluidized bed of particles, each having a glass bead core about 60 $\mu$m in diameter and a silver surface layer about 0.5 $\mu$m thick. Particles carried by the Toray plate to the transfer roll were pressed into the adhesive layer of a transfer tape. Its adhesive was a phenyl-containing siloxane pressure-sensitive adhesive (GE 6574), 50 $\mu$m thick, and its backing was 60 $\mu$m biaxially oriented poly(ethyleneterephthalate) film, each surface of which had been provided with a low-adhesion backsize coating of a perfluoropolyether polymer as disclosed ill U.S. Pat. No. 4,472,480 (Olson). The resulting electrically conductive adhesive transfer tape was wound upon itself into a roll for storage. After being unwound, a photomicrograph was made of the face of the tape, a fragment of which is shown in FIG. 4 of the drawing. The full photomicrograph showed only one particle at almost every dot and two side-by-side particles at a few dots. A highlight at the top of each particle suggests that each particle is partially uncoated.

EXAMPLES 3 and 4

Two electrically conductive pressure-sensitive adhesive tapes were made as in Example 2 except that the silicone rubber dots were about 100 μm in diameter. The dots were on 1.27-mm centers when making the tape of Example 3 and on 0.63-mm centers when making the tape of Example 4. Each of these tapes was tested for 180° peel adhesion in comparison to a "control"]tape which was identical except having no particles. The 180° peel adhesion was measured from glass under ASTM D330-81, Method B, except using an "I-mass" adhesion tester 3M-90 in a controlled atmosphere of 22° C. and 50% relative humidity.

Initial adhesion measurements were made within five minutes after adhering a tape to the glass at 22° C. Some of the specimens were placed in an oven at 70° C. for either 3 or 5 days and then held at the aforementioned controlled atmosphere overnight before testing. Results reported in Table I include testing of both the face side (FS) and the back side (BS). Also reported in Table I are tests for electrical resistance at 22° C., 50% RH, between two electrodes, each about 2.5 cm square, adhered to each other by one of these tapes.

TABLE I

| Tape of Example | 180° Peel Adhesion (N/dm) | | | | | | Electrical Resistance (ohms/cm$^2$) |
|---|---|---|---|---|---|---|---|
| | Initial | | After 3 days at 70° C. | | After 5 days at 70° C. | | |
| | FS | BS | FS | BS | FS | BS | |
| 3 | 13.1 | 17.1 | 15.1 | 18.0 | 17.1 | 17.1 | 0.0071 |
| 4 | 13.7 | 17.4 | 12.6 | 14.8 | 15.4 | 15.7 | 0.0069 |
| Control | 17.5 | 17.4 | 15.9 | 15.9 | 15.9 | 16.5 | 10$^8$ |

Although the initial 180° peel adhesion of the face side (FS) of each of the tapes of Examples 3 and 4 was somewhat lower than that of the control, the values are close enough to indicate that strong bonds can be made at ambient temperatures. The differences in 180° peel adhesion values of the tapes of Examples 3 and 4 versus the control tape are within experimental error. Hence, the electrically conductive particles are not interfering with adhesive values. The electrical conductivities of the tapes of Examples 3 and 4 are surprisingly good, considering the relatively wide spacing between their electrically conductive particles.

EXAMPLE 5

An electrically conductive pressure-sensitive adhesive transfer tape was made as in Example 2 except that the particles were on 125-μm centers. Used to test the electrical conductivity of this tape was a rigid printed circuit board having a first set of 17 parallel solder-coated copper electrode strips, each 35 μm thick and 1.4 mm wide, spaced 1.1 mm from adjacent electrode strips, and a second identical set of 17 electrically conductive electrode strips aligned lengthwise with and spaced 2.5 cm from the first set. A strip of this adhesive transfer tape was used to adhere, to each of the two sets, one end of a 6-cm long flexible printed circuit (on polyimide film 25 μm thick) having a third identical set of electrically conductive strips, with one strip at each end of the flexible printed circuit overlying one set of 17 strips of the rigid printed circuit over a length of 1 cm. Good adhesive contact was assured by pressing with a hand-held wooden roller. The flexible printed circuit formed a loop rising above the rigid printed circuit, thus creating a modest lifting force that did not cause any adhesive failure.

A load of 7 amperes at 12 volts DC was carried between aligned pairs of conductive strips of the first and second sets, but at 8 amperes the conductive strip of the flexible printed circuit failed in the manner of a wire fuse. The same result was obtained between other aligned conductors of the first and second sets. From this, it was determined that the adhesive transfer tape could carry at least 60 amperes/cm$^2$ DC through its thickness.

EXAMPLE 6

An electrically conductive pressure-sensitive adhesive transfer tape was made as in Example 2 except that the silicone rubber dots were about 100 μm in diameter and on 0.625-mm centers. Every dot attracted at least one particle, and there were at least 2 particles, and occasionally 3, at about half of the dots.

The resulting electrically conductive adhesive layer of the transfer tape was used to interconnect two sets of 17 electrode strips in the same manner as in Example 5.

A power source was connected to each electrode of one set on the rigid printed circuit board, and a box containing 14 LEDs (light emitting diodes) was connected to 14 of the 17 electrode strips of the other set. The power source pulsed current sequentially through the 14 connected pairs so as to sequentially illuminate each of the 14 LEDs. This assembly was used for demonstration purposes for about three months, running some days for 6 or 7 hours. Every LED always lighted, and no more than one LED ever lighted at one time, thus indicating that there was no shorting caused by the strips of adhesive transfer tape.

We claim:
1. Adhesive tape comprising a backing carrying an adhesive layer of substantially uniform thickness in which are individually positioned in a predetermined pattern of laterally spaced, electrically conductive, equiax particles of substantially uniform diameter about equal to or somewhat larger than the adhesive thickness, thus making the adhesive layer electrically conductive through its thickness and electrically insulating laterally, wherein the improvement comprises:
   said particles having a hardness relative to the hardness of an electrically conductive element to which the tape is to be bonded so that when two of said elements are adhered together with a piece of the tape, the particles penetrate those elements upon application of pressure, form a crater in said elements and remove oxides, and
   substantially all of said particles have a diameter about equal to or larger than the adhesive thickness.
2. Adhesive tape as defined in claim 1 wherein said adhesive is a pressure-sensitive adhesive, and both the diameter of the equiax particles and the thickness of the adhesive layer are within the range of 25 to 150 μm.
3. Adhesive tape as defined in claim 2 wherein each of said equiax particles has a core with a Knoop Hardness Value of at least 300 and an electrically conductive surface layer, the thickness of which is no more than 10% of the diameter of the core.

4. Adhesive tape as defined in claim 3 wherein the thickness of the electrically conductive surface layer is within the range of 0.1 to 2 µm.

5. Adhesive tape as defined in claim 4 wherein the core of said equiax particles is selected from ceramic, steel, nickel, and work-hardened copper, and the electrically conductive surface layer is selected from gold, silver, tin, and solder.

6. Adhesive tape as defined in claim 5 wherein the electrically conductive particles are substantially spherical.

7. Adhesive tape as defined in claim 1 wherein said adhesive is a pressure-sensitive adhesive, and a great length of the tape is wound upon itself in roll form, said predetermined pattern repeating a large number of times over the length of the tape.

8. Adhesive tape as defined in claim 1, the adhesive of which is a pressure-sensitive adhesive and the backing of which is a disposable carrier web having a low-adhesion backsize coating covering each of its faces.

9. Electrically conductive pressure-sensitive adhesive tape as defined in claim 8 wherein the pressure-sensitive adhesive is a silicone.

10. Electrically conductive pressure-sensitive adhesive tape as defined in claim 9 wherein the backing is biaxially oriented poly(ethyleneterephthalate) film, both surfaces of which have a low-adhesion backsize coating of a perfluoropolyether polymer.

11. Adhesive tape as defined in claim 1 wherein the electrically conductive particles occupy from 0.05 to 5 percent of the area of the adhesive layer.

12. Adhesive tape as defined in claim 1 wherein the particles occupy individual, laterally spaced positions, there being only one particle per position except for two or three particles at a few positions, the particles occupying no more than 5% of the area of the adhesive layer.

13. Adhesive tape as defined in claim 1 wherein the tape is designed to form electrical connections to pads of an integrated circuit chip or the like, a plurality of particles being located at each pad-contacting area.

14. Adhesive tape as defined in claim 1 wherein said equiax particles occupy from 0.05 to 1.0% of the area of the adhesive layer.

15. Adhesive tape as defined in claim 2 and wound upon itself in a roll of great length, said equiax particles being arranged in rows extending both longitudinally and laterally.

16. Adhesive tape as defined in claim 1 wherein said adhesive layer is in contact with and adhered to said electrically conductive elements and wherein said particles have penetrated said electrically conductive elements.

17. Adhesive tape as defined in claim 1 which has been applied to said electrically conductive elements, pressure has been applied to said elements, and said particles have penetrated said elements as a result of said pressure.

18. Adhesive tape as defined in claim 1 wherein said particles have a Knoop hardness of at least 300.

19. Adhesive tape comprising a backing carrying an adhesive layer of substantially uniform thickness in which are individually positioned in a predetermined pattern of laterally spaced, electrically conductive, equiax particles of substantially uniform diameter about equal to or somewhat larger than the adhesive thickness, thus making the adhesive layer electrically conductive throughout its thickness and electrically insulating laterally, wherein:

said particles have a Knoop Hardness Value of at least 300 and have a hardness that is greater than that of an electrically conductive element, so that when such elements are adhered together with a piece of the tape, the particles penetrate those elements upon application of pressure and form a crater in said elements and remove oxides; and wherein substantially every particle is exposed at one face of the adhesive.

* * * * *